(12) United States Patent
Fan

(10) Patent No.: US 7,950,932 B2
(45) Date of Patent: May 31, 2011

(54) LOW PROFILE SOCKET CONNECTOR

(75) Inventor: Chia-Wei Fan, Tu-Cheng (TW)

(73) Assignee: Hon Hai Precision Ind. Co., Ltd., New Taiepi (TW)

( * ) Notice: Subject to any disclaimer, the term of this patent is extended or adjusted under 35 U.S.C. 154(b) by 0 days.

(21) Appl. No.: 12/756,966

(22) Filed: Apr. 8, 2010

(65) Prior Publication Data

US 2010/0317232 A1 Dec. 16, 2010

(30) Foreign Application Priority Data

Jun. 16, 2009 (CN) .......................... 2009 1 0303277

(51) Int. Cl.
*H01R 12/00* (2006.01)
(52) U.S. Cl. ........................................................ 439/82
(58) Field of Classification Search .................... 439/82, 439/66, 733.1, 75, 862, 930, 943
See application file for complete search history.

(56) References Cited

U.S. PATENT DOCUMENTS

| 5,419,710 | A | 5/1995 | Pfaff | |
|---|---|---|---|---|
| 5,456,613 | A | 10/1995 | McHugh | |
| 6,957,987 | B2 | 10/2005 | Ma et al. | |
| 7,001,197 | B2 | 2/2006 | Shirai et al. | |
| 7,435,102 | B2 * | 10/2008 | Goodman | 439/70 |
| 7,753,695 | B2 * | 7/2010 | Howell | 439/82 |

* cited by examiner

*Primary Examiner* — Chandrika Prasad

(74) *Attorney, Agent, or Firm* — Andrew C. Cheng; Wei Te Chung; Ming Chieh Chang

(57) ABSTRACT

An electrical connector includes a base plate, a plurality of contacts, and a plurality of solder portions. The base plate has a plurality of through holes extending from a top surface and a bottom surface therebetween. The contacts is assembled in through holes, and each contact comprises a spring portion disposed upon the top surface, a soldering portion passing through the through hole and with a tail extending beyond the bottom surface, and a stopping portion connecting the spring portion and the soldering portion and abutting against the top surface. The solder portions are attached to the tails of the soldering portions for fixing the contacts to the base plate.

15 Claims, 9 Drawing Sheets

LOW PROFILE SOCKET CONNECTOR

BACKGROUND OF THE INVENTION

1. Field of the Invention

The present invention relates to a socket connector, and more particularly to a socket connector having low-profile contact terminals so as to reduce the profile of the socket connector. The present invention also relates a method for making the same.

2. Description of Related Art

Various types of conventional electrical connectors used for attaching electronic packages are well known to the skilled in the art. The electronic packages are classified as ball grid array packages, pin grid array packages, and land grid array packages in view of the interface of the electronic packages, i.e. pin legs or conductive pads of the electronic packages. The electrical connector for attaching ball grid array package can refer to U.S. Pat. No. 5,419,710; the electrical connector for attaching pin grid array package can be referred to U.S. Pat. No. 5,456,613; and the electrical connector for attaching land grid array package can be referred to U.S. Pat. Nos. 7,001,197 and 6,957,987.

U.S. Pat. No. 6,957,987 issued to Ma et al. on Oct. 25, 2005 discloses an electrical connector having an insulative housing with a plurality of contacts received therein, a stiffener surrounding the insulative housing, and a load plate and a lever pivotally mounted to two opposite ends of the stiffener. The insulative housing is formed by molding an insulative synthetic resin and defining a plurality of passageways. The contact is formed by stamping and has a retention portion with barbs on opposite sides thereof for securing the contact in the passageway. A spring portion and a connecting portion extend upwardly from the retention portion, and the spring portion has a mating portion extending beyond a top surface of the insulative housing and the connecting portion is completely received in the passageway. A solder pad extends perpendicular to the retention portion and connects with the retention portion by a neck portion.

However, the insulative housing of above electrical connector has comparable thick in dimension and the contact geometry thereof also has a bulky dimension. If the insulative housing is made thinner, the overall strength of the insulative housing will not meet the requirement. Furthermore, the configuration of the contact is not adapted to a low profile electrical connector.

Therefore, an improved electrical connector is needed.

SUMMARY OF THE INVENTION

An object of the present invention is to provide a low profile electrical connector.

To achieve the aforementioned object, an electrical connector comprises a base plate, a plurality of contacts, and a plurality of solder portions. The base plate has a plurality of through holes extending from a top surface and a bottom surface therebetween. The contacts are assembled in through holes, and each contact comprises a spring portion disposed upon the top surface, a soldering portion extending through the through hole and with a tail extending beyond the bottom surface, and a stopping portion connecting the spring portion and the soldering portion and abutting against the top surface. The solder portions are attached to the tails of the soldering portions for securing the contacts to the base plate.

Other objects, advantages and novel features of the invention will become more apparent from the following detailed description of a preferred embodiment when taken in conjunction with the accompanying drawings.

DETAILED DESCRIPTION OF THE INVENTION

Figure 1:
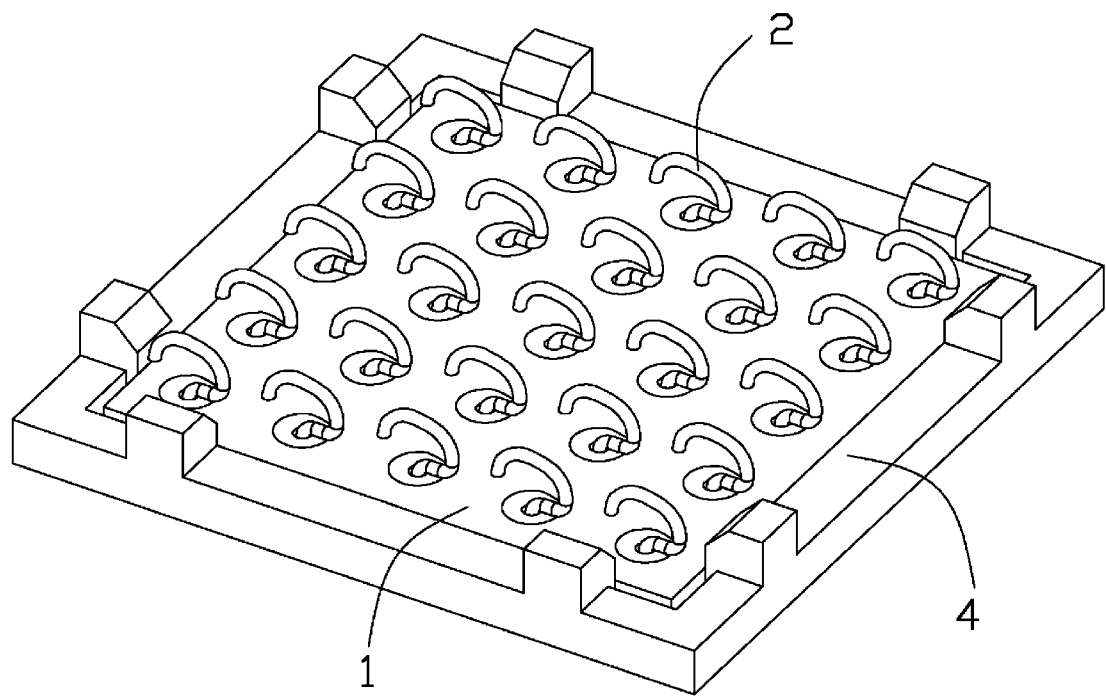
FIG. 1 is an assembled, perspective view of an electrical connector in accordance with the present invention.
Figure 2:
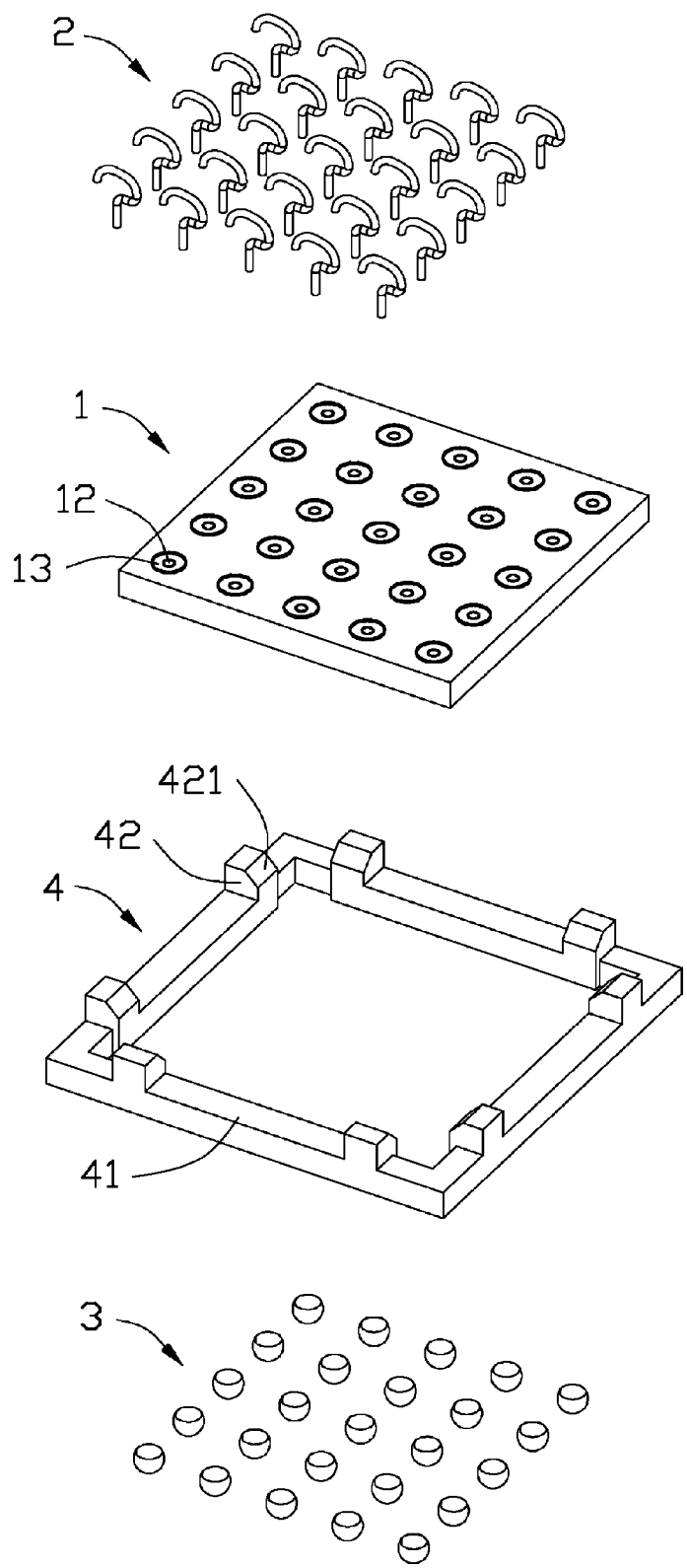
FIG. 2 is an exploded view, perspective of the electrical connector shown in FIG. 1.

Referring to FIGS. 1 and 2, an electrical connector used for electrically connecting an electronic package 5 and a printed circuit board, comprises a base plate 1 with a plurality of contacts 2, a number of solder portions 3 attached to the contacts 2, and an accommodating member 4 mounted upon the base plate 1.

The electronic package 5 includes a substrate 51 and a plurality of conductive pad 52 arranged on a bottom surface of the substrate 51. The conductive pads 52 press top ends of the contacts 2 of the electrical connector for establishing an electrical connection therebetween.

The base plate 1 is configured with the printed circuit board material or glass fibers. The base plate 1 having a top surface 10 and a bottom surface 11 opposite the top surface 10. A plurality of through holes 12 are defined by passing through the top surface 10 and bottom surface 11 and each has a metallic coating 13 therein for fixing the solder portion 3 on a tail of the contact 2.

The contact 2 is made by a metal haulm thereby having a linear configuration and comprises a spring portion 20 for mating with the electronic package 5, a soldering portion 22 for attaching the solder portion 3, and a stopping portion 21 connecting the spring portion 20 and the soldering portion 22. The spring portion 20, the stopping portion 21 and soldering portion 22 are arranged in a common surface for facilitative manufacture and reducing overall dimension, and being adapted for can be arranged in high density. The spring portion 20 has a substantially curved configuration and is extending beyond the top surface 10. The stopping portion 21 substantially extends along a horizontal direction from a lower end of the spring portion 20 so as to abut against the top surface 10 to keep the contact 2 in the base plate 1. The soldering portion 22 extends downwardly from the stopping portion 21 and has a tail extending beyond the bottom surface 11. The soldering portion 22 passes through the through hole 12 without any interference therebetween, so the contact 2 can move freely before the soldering ball 3 is reflowed with a solder mass. The soldering ball 3 is attached to the tail of the soldering portion 22 of the contact 2 and connects the metallic coating 13, the bottom surface of the base plate 1 and the contact 2 together to secure the contact 2 in the through hole 12 of the base plate 1.

Figure 3:
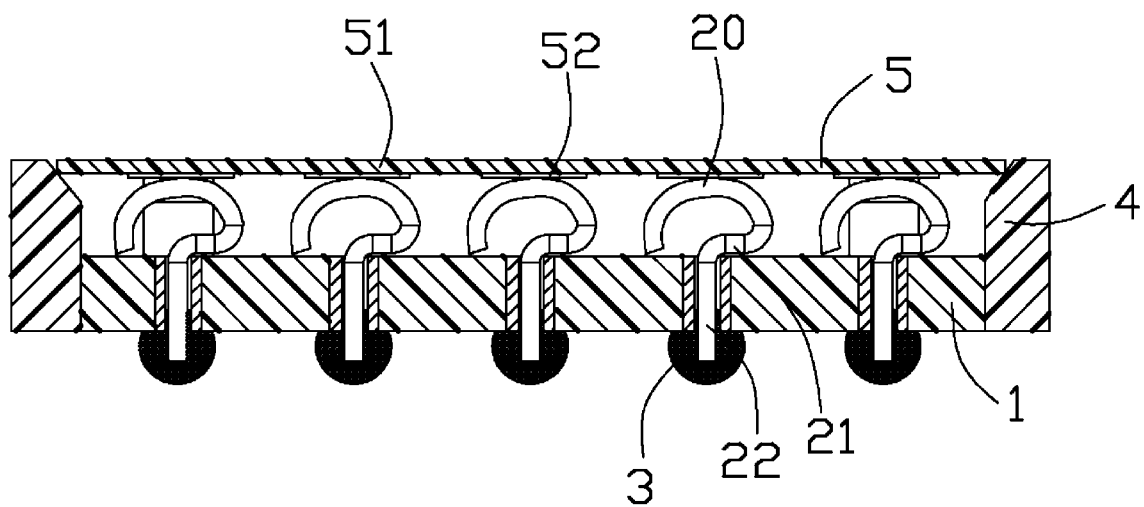
FIG. 3 is a cross-sectional view of the electrical connector mating with an electronic package.

Referring to FIG. 3, the accommodating member 4 is mounted surrounding the base plate 1 for orientating the electronic package 5. The accommodating member 4 has a frame 41 with a plurality of datum 42 protruding upwardly. A chamfer 42 is defined on each datum 42 for leading the electronic package 5 into the frame 41.

Figure 4:
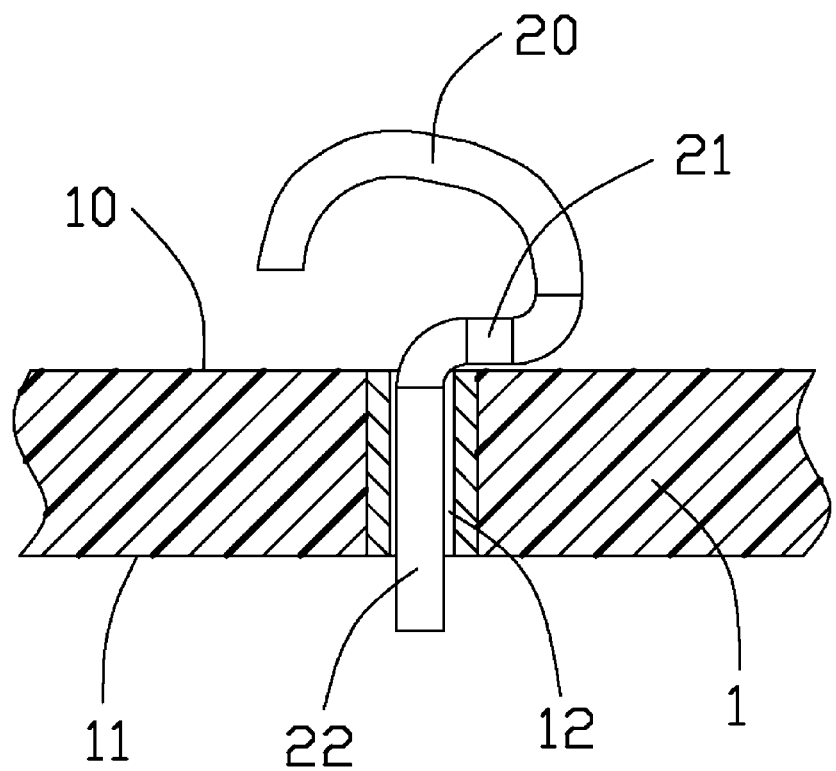
FIG. 4 is a schematic view of the electrical connector, showing a contact received in a base plate of the electrical connector.
Figure 5:
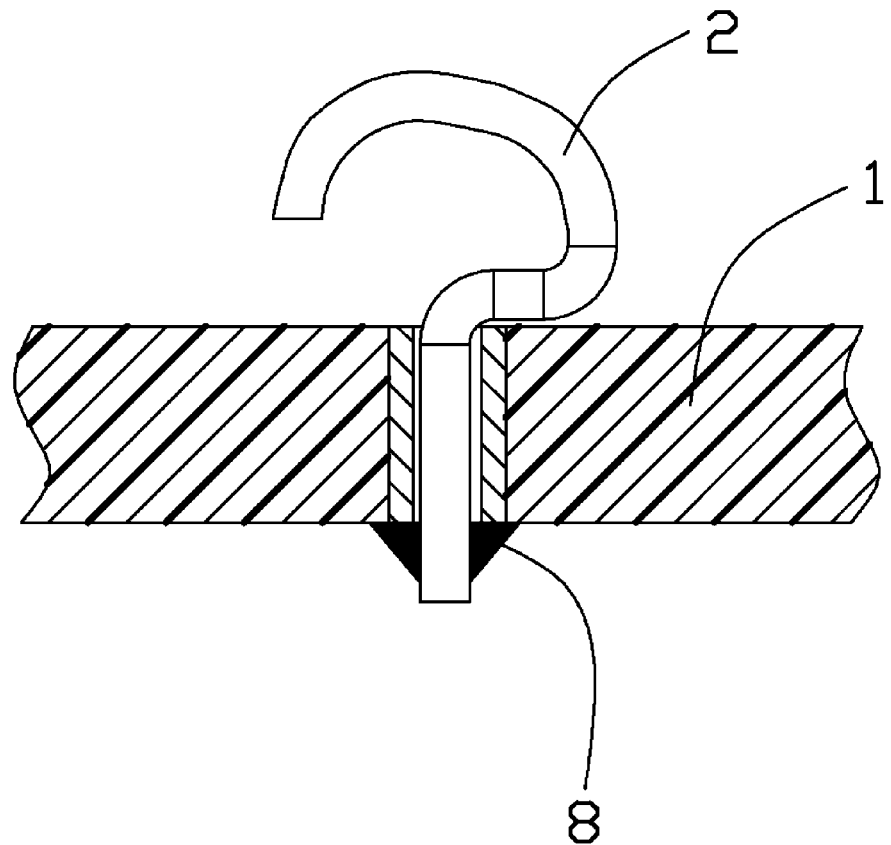
FIG. 5 is another schematic view of the electrical connector, showing the contact predetermined secured in the base plate.
Figure 6:
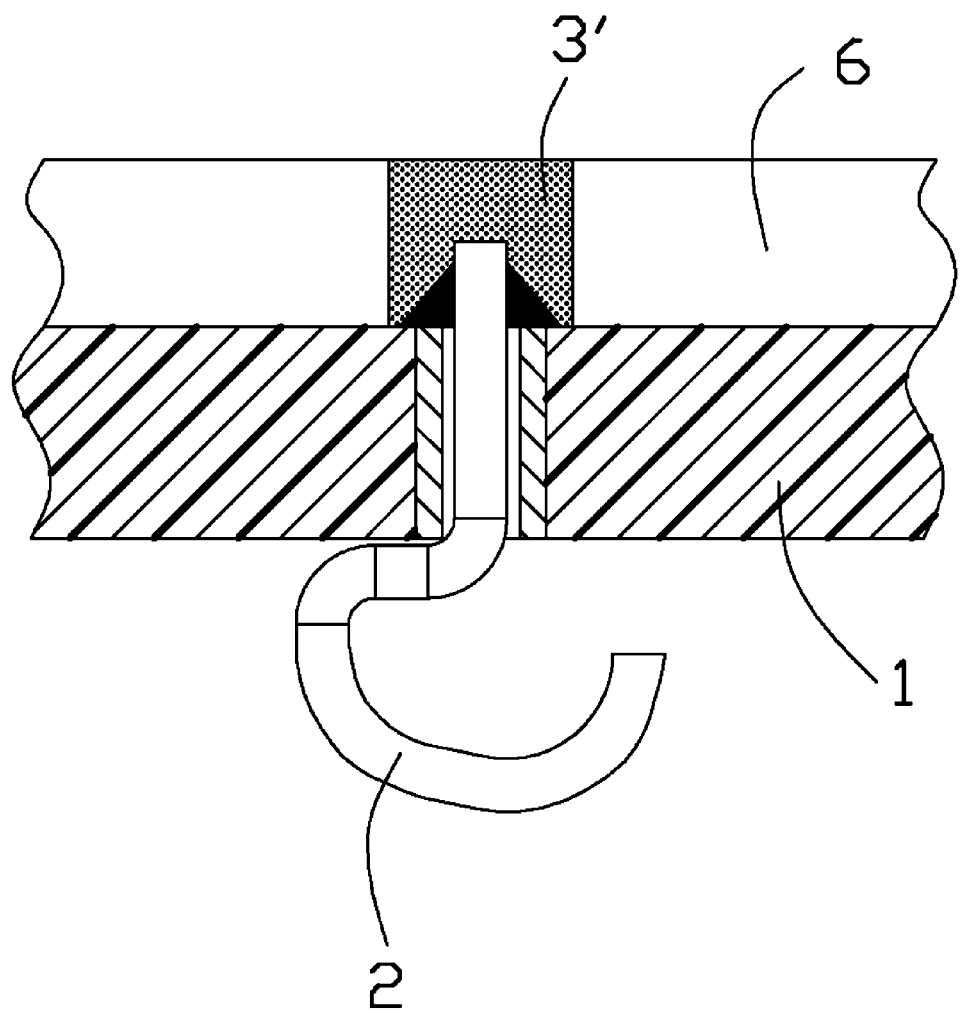
FIG. 6 is a schematic view, wherein a solder paste is arranged to the electrical connector by a tool mounted on the base plate.
Figure 7:
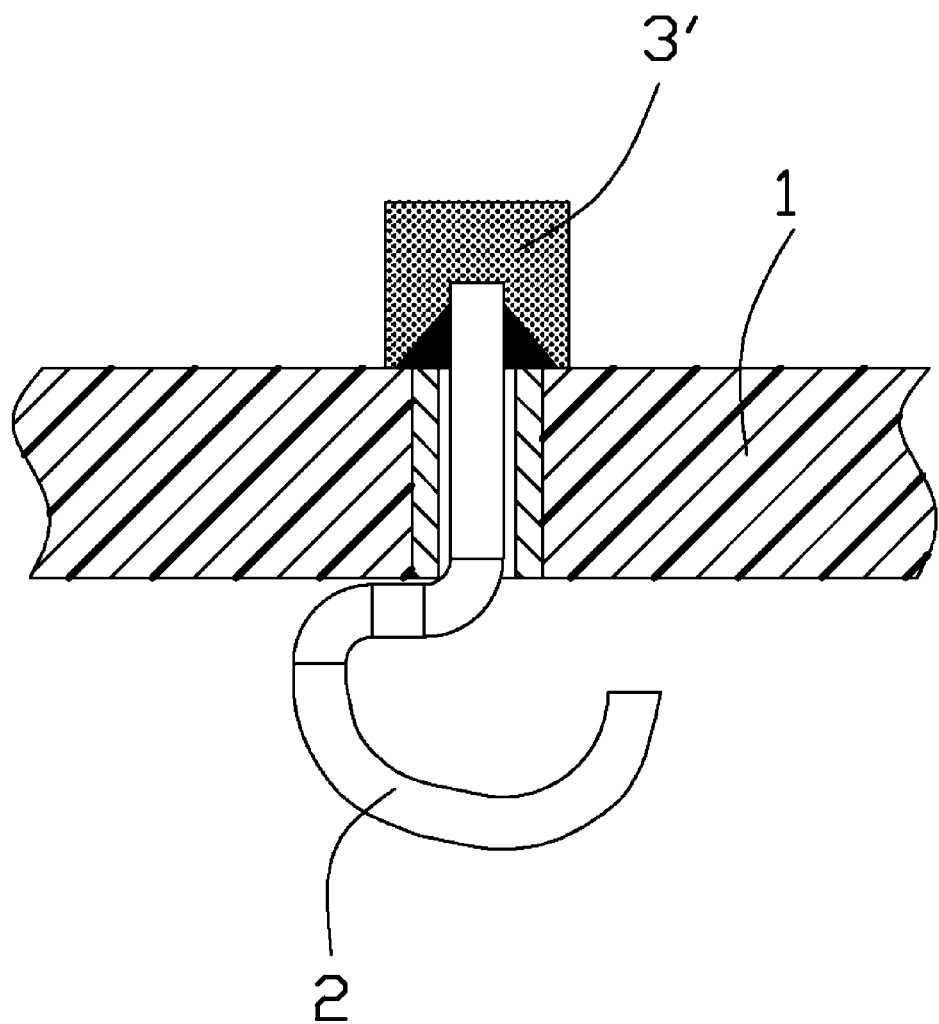
FIG. 7 is similar to FIG. 6, but the tool is removed from the base plate.
Figure 8:
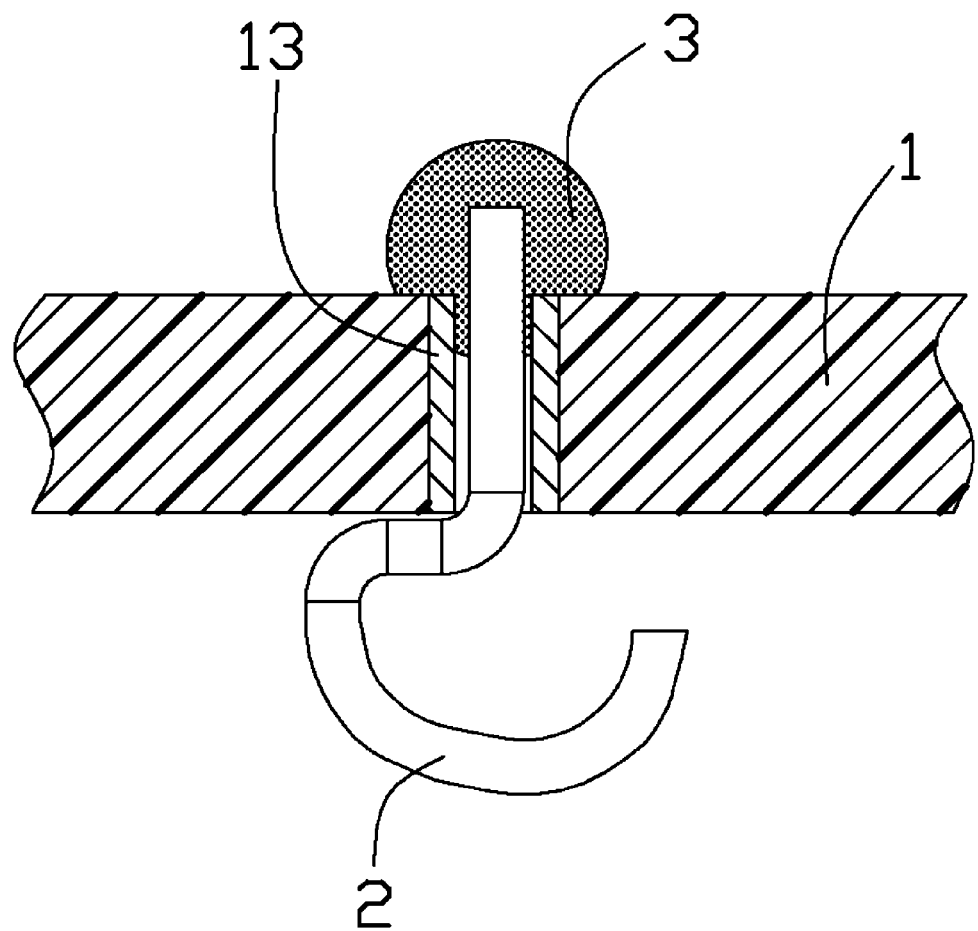
FIG. 8 is similar to FIG. 7, except that the solder paste is reflowed.

A method for manufacturing the electrical connector described above is also provided and described below. The method includes following steps: (1) providing a plurality of contacts 2, each contact 2 having a spring portion 20, a stopping portion 21 connected with the spring portion 20 and a soldering portion 22 connected with the stopping portion 21; (2) providing a base plate 1 with a top surface 10 and a bottom surface 11, a plurality of through holes 12 passing through the top surface 10 and the bottom surface 11; (3) assembling the soldering portions 22 of the contacts 2 in the through holes 12, wherein the stopping portions 21 abut against the top surface 10, as shown in FIG. 4; (4) previously fixing the contacts 2 to the base plate 1 by a little solder 8, as shown in FIG. 5; (5) reversing the base plate 1 to make the bottom surface 11 at a top side and providing enough solder paste 3' on the bottom surface of the base plate 1 around a tail of soldering portion 22 by a tool 6, as shown in FIG. 6; (6) removing the tool 6 from the base plate 1, as shown in FIG. 7; (7) reflowing the solder pastes 3' to form solder portions 3 to fix the contacts 2 to the base plate 1, as shown in FIG. 8.

Figure 9:
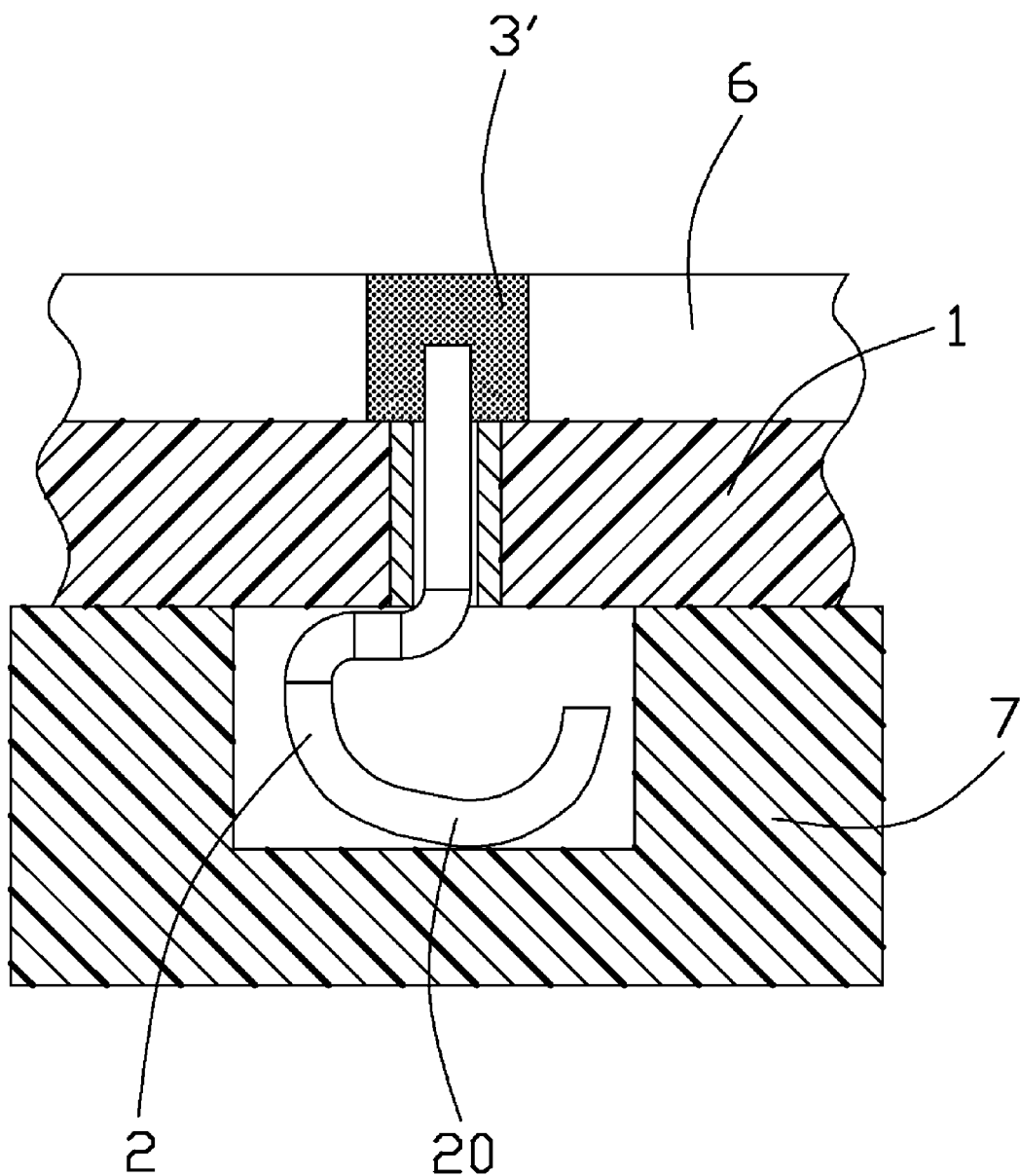
FIG. 9 is another schematic view of the electrical connector, showing the contact predetermined secured in a base plate.

Various methods can be provided for achieving the step (4) to pre-fix the contacts 2 in the base plate 1. The first method is shown in FIG. 5, the contacts 2 are soldered through wave soldering to make each tail of the contact 2 be touched up with a little solder 8, in this condition, the contacts 2 are temporarily positioned in the base plate 1 for preventing its rotation in the through hole 12. FIG. 9 shows another method, a cover 7 is mounted on the top surface 10 of the base plate 1 to supporting the spring portions 20. Thus, when the base plate 1 is disposed up-side-down, the contacts 2 will not drop from the base plate 1, and cover 7 can remove when the contacts 2 are soldered by the solder portions 3.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   a base plate with a top surface and a bottom surface, a plurality of through holes extending through the top surface and the bottom surface, and a metallic coating disposed in an inner sidewall of each through hole;
   a plurality of contacts assembled in the through holes, each contact comprising:
   a spring portion disposed upon the top surface;
   a soldering portion extending through the through hole and formed with a tail extending beyond the bottom surface;
   a stopping portion connecting the spring portion and the soldering portion and abutting against the top surface; and
   a plurality of solder balls attached to the tails of the soldering portions and the bottom surface of the base plate to secure the contacts to the base plate; wherein
   the through hole communicates with the solder ball, thereby allowing the soldering material to flow into the through hole and be jointed with the metallic coating when the solder ball melts.

2. The electrical connector as claimed in claim 1, wherein the contact is made from metal haulm.

3. The electrical connector as claimed in claim 2, wherein the spring portion, the stopping portion, and the soldering portion of one contact are designed in a common plane.

4. The electrical connector as claimed in claim 1, wherein the spring portion is configured with a curved shape.

5. The electrical connector as claimed in claim 1, wherein the stopping portion extends substantially horizontal and perpendicular to the soldering portion.

6. The electrical connector as claimed in claim 1, wherein the base plate is made of a material same as that of a printed circuit broad.

7. The electrical connector as claimed in claim 1, further comprising an accommodating member comprising a frame surrounding the base plate and a plurality of chamfer protruding upwardly frame.

8. An electrical connector assembly comprising:
   an insulative base defining opposite upper and bottom surfaces thereon in a vertical direction;
   a plurality of through holes extending through the base and the corresponding upper and bottom surfaces in said vertical direction, each of said through holes being coated with conductive material;
   a plurality of contacts assembled to the base, each of said contact defining unitarily a straight section extending downwardly through the corresponding through hole with thereof a tip extending downwardly beyond the bottom surface with a solder mass attached thereon, and a stop section extending from an uppermost tip of the straight section with at least an abutment portion seated upon the upper surface so as to cooperate with the solder mass, a cross-sectional dimension of which is larger than that of the through hole, to restrain an up-and-down movement of the corresponding contact relative to the base, and a resilient contact section upwardly and curvedly extending from the stop section opposite to the uppermost tip of the straight section and with a contact point at a top; wherein
   the straight section and the corresponding through hole do not perform any mechanical interference engagement therebetween.

9. The electrical connector assembly as claimed in claim 8, wherein the straight section of the contact and the corresponding through hole contact each other in a metal-to-metal confrontation.

10. The electrical connector assembly as claimed in claim 8, wherein said stop section extends essentially horizontal upon the upper surface.

11. The electrical connector assembly as claimed in claim 8, wherein without securement between the corresponding solder mass and the bottom surface, the contact will be withdrawn from the base.

12. An electrical connector assembly comprising:
   an insulative base defining opposite upper and bottom surfaces thereon in a vertical direction;
   a plurality of through holes extending through the base and the corresponding upper and bottom surfaces in said vertical direction;
   a plurality of contacts assembled to the base, each of said contact defining unitarily a straight section extending downwardly through the corresponding through hole with thereof a tip extending downwardly beyond the bottom surface with a solder mass attached thereon, and a stop section extending from an uppermost tip of the straight section with at least an abutment portion seated upon the upper surface so as to cooperate with the solder mass, a cross-sectional dimension of which is larger than that of the through hole, to restrain an up-and-down movement of the corresponding contact relative to the base, and a resilient contact section upwardly and curvedly extending from the stop section opposite to the uppermost tip of the straight section and with a contact point at a top; wherein the straight section and the corresponding through hole do not perform any mechanical interference engagement therebetween.

13. The electrical connector assembly as claimed in claim 12, wherein said stop section extends essentially horizontal upon the upper surface.

14. The electrical connector assembly as claimed in claim 12, wherein without securement between the corresponding solder mass and the bottom surface, the contact will be withdrawn from the base.

15. The electrical connector as claimed in claim 1, wherein the contact is made from metallic haulm, and the spring portion has a tip extending downwardly and engaged with the top surface of the insulative housing when an electronic package is mounted to the insulative housing.

* * * * *